United States Patent
Liu et al.

(10) Patent No.: US 8,453,324 B2
(45) Date of Patent: Jun. 4, 2013

(54) METHOD OF MANUFACTURING FPCB SUBSTRATE

(75) Inventors: Rui-Wu Liu, Shenzhen (CN); Yung-Wei Lai, Taoyuan (TW); Shing-Tza Liou, Taoyuan (TW)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 13/306,811

(22) Filed: Nov. 29, 2011

(65) Prior Publication Data

US 2012/0066903 A1    Mar. 22, 2012

Related U.S. Application Data

(62) Division of application No. 12/170,735, filed on Jul. 10, 2008, now abandoned.

(30) Foreign Application Priority Data

Nov. 12, 2007   (CN) .......................... 2007 1 0202476

(51) Int. Cl.
    *H01K 3/10* (2006.01)
(52) U.S. Cl.
    USPC .................. 29/852; 29/847; 174/261; 439/84

(58) Field of Classification Search
    USPC .............. 29/830, 846, 847, 852, 853; 216/14, 216/65; 174/254, 261, 262; 361/749; 439/66, 439/84
    See application file for complete search history.

(56) References Cited

U.S. PATENT DOCUMENTS

| | | | |
|---|---|---|---|
| 4,870,476 A * | 9/1989 | Solstad | 257/696 |
| 6,939,142 B2 * | 9/2005 | Maruyama et al. | 439/66 |

\* cited by examiner

*Primary Examiner* — Donghai D. Nguyen
(74) *Attorney, Agent, or Firm* — Altis Law Group, Inc.

(57) ABSTRACT

A method for manufacturing a FPCB substrate includes the following steps. First, a FPCB material including an insulation layer and an electrically conductive layer formed on the insulation layer is provided. The electrically conductive layer has a first surface and an opposite second surface. The insulation layer has a third surface and an opposite fourth surface. The third surface comes into contact with the second surface. Secondly, a through hole extends from the first surface to the fourth surface is formed. The through hole includes a metal hole in the electrically conductive layer and an insulation hole in the insulation layer. Thirdly, the insulation hole is enlarged to expose a portion of the electrically conductive layer around the metal hole. Finally, the exposed portion is bent to form a hook which passes through the enlarged insulation hole and protrudes out from the fourth surface of the insulation layer.

4 Claims, 6 Drawing Sheets

METHOD OF MANUFACTURING FPCB SUBSTRATE

CROSS-REFERENCE TO RELATED APPLICATION

This application is a divisional application of and claims the benefit of U.S. patent application Ser. No. 12/170,735 filed Jul. 10, 2008, now abandoned, entitled "FPCB SUBSTRATE AND METHOD OF MANUFACTURING THE SAME", the entire contents of which are incorporated herein by reference.

BACKGROUND

1. Technical Field

The present disclosure relates to a method of manufacturing the FPCB substrate.

2. Description of Related Art

Nowadays, flexible printed circuit boards (FPCBS) are widely used in portable electronic devices such as mobile phones, digital cameras and personal digital assistants (PDAs). In some electronic devices, certain parts are movable relative to a main body. In these electronic devices, FPCBS can maintain an electrical connection between the main body and the movable parts due to their flexibility.

Generally, a FPCB is made of a sheet of a FPCB substrate. During a process of manufacturing the FPCB, for example, a plating process, a FPCB substrate 15 is required to be fixed to a rack 10, as shown in FIG. 5. A number of positioning holes 151 are formed along the edges of the FPCB substrate 15. The rack 10 includes a suspender 11 and a frame 12 connected to the suspender 11. The suspender 11 is configured for moving the frame 12 to a certain position. The frame 12 defines a number of holes 13 corresponding to the positioning holes 151. Thus, the FPCB substrate 15 is fixed to the frame 12 by a number of bolts 14 fastening through the positioning holes 151 and the corresponding hole 13.

After the plating process of the FPCB substrate 15, the FPCB substrate 15 is required to be disassembled from the frame 12. Because the FPCB substrate 15 is fixed to the frame by the bolts 14, much time may be spent disassembling the FPCB substrate 15, thus the process of treating the FPCB substrate 15 may be unduly prolonged. In addition, in the plating process, the bolts 14 are soaked in a plating solution for a long time, which may be subjected to corruption by the plating solution, thereby affecting the fastening performance of the bolts 14.

In order to overcome the above-mentioned defect of using the bolt 14 fixing the FPCB substrate 15, another fixing manner is developed. Referring to FIG. 6, a magnet 25 is used to fix the FPCB substrate 15 to a rack 20. The rack 20 is made of magnetism material, and the FPCB substrate 15 is fixed between the rack 20 and the magnet 25 by a magnetic force. In order to ensure the FPCB substrate 15 being stably fixed between the rack 20 and the magnet 25, a diameter of the magnet 25 is no less than 20 millimeters. Therefore, the FPCB substrate 15 should define a section/portion with a suitable size (i.e., no less than 20 millimeters) for arranging the magnet 25 thereon. However, after the FPCB has been manufactured, the section/portion for arranging the magnet 25 is thrown away, thereby increasing the amount of waste materials of the FPCB substrate 15.

Therefore, what is needed is a method of manufacturing the FPCB substrate which can overcome the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Embodiments will now be described in detail below and with reference to the drawings.

Figure 1:
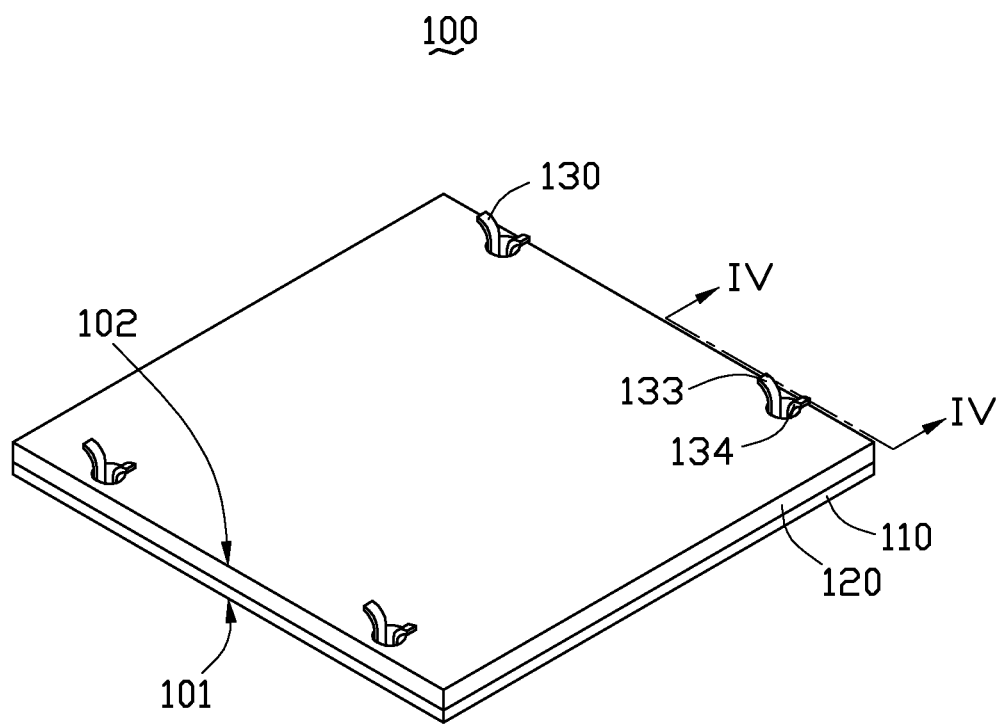
FIG. 1 is a schematic view of a flexible printed circuit board substrate, in accordance with an embodiment.
Figure 2:
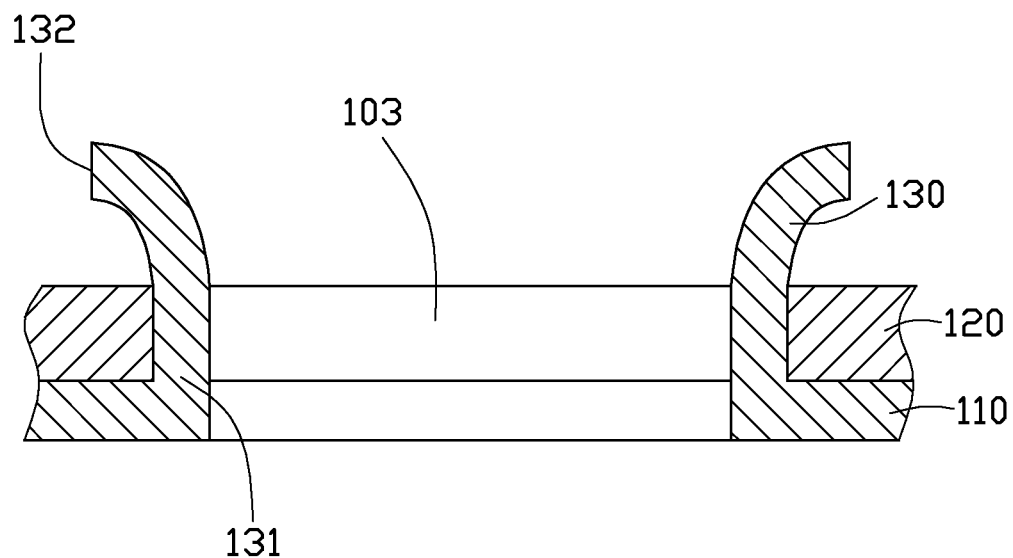
FIG. 2 is an enlarged cross-sectional view of the flexible printed circuit board substrate along line IV-IV of FIG. 1.

Referring to FIG. 1 and FIG. 2, a single-sided FPCB (flexible printed circuit board) substrate 100 includes an electrically conductive layer 110, an insulation layer 120, and a hook 130. The electrically conductive layer 110 is formed on the insulation layer 120. The FPCB substrate 100 includes a first surface 101 (i.e., a surface of the electrically conductive layer 110) and a second surface 102 at an opposite side thereof to the first surface 101 (i.e., a surface of the insulation layer 120). At least a through hole 103 is formed in the electrically conductive layer 110 and the insulation layer 120 extending from the first surface 101 to the second surface 102. The hook 130 is functioned as a positioning element and is configured for fixing (e.g., hanging, hitching or other fixing manner) the FPCB substrate 100 to a tool (e.g., a rack used in plating process). The hook 130 is a unitary part of the electrically conductive layer 110 and extends from a portion of the electrically conductive layer 110 through the through hole 103 and protrudes out from the second surface 102 (i.e. the surface of the insulation layer 120). The hook 130 and the electrically conductive layer 110 are made of a same electrically conductive metal such as copper, and compose an integrated structure.

In detail, the hook 130 includes a first end 131 and a second end 132. The first end 131 integrates with the electrically conductive layer 110, and is a unitary portion of the electrically conductive layer 110. That is, there is no interface between the first end 131 and the electrically conductive layer 110. In addition, the first end 131 can be a close configuration entirely surrounding an edge of the through hole 103, or a discrete configuration partially surrounding the edge of the through hole 103. For example, the first end 131 can be a circle configuration or an arc configuration. The second end 132 is curved or obliquely oriented relative to the second surface 102 so as to form a fixing structure such as a hook or a claw capable of fixing the FPCB substrate 100 to a tool (e.g., the rack used in plating process). According to configurations of the first end 131 and the second end 132, the hook 130 is not limited to be trumpet-shaped and petal-shaped. In the present embodiment, the hook 130 is petal-shaped and has two petals 133, 134. The two petals 133, 134 are curved relative to the second surface 102 along two opposite directions, thereby forming the two petal-shaped configurations.

A length of the hook 130, i.e., a length between the first end 131 and the second end 132, is greater than a combined thickness of the electrically conductive layer 110 and the insulation layer 120. The length of the hook 130 is in a range from about 1 millimeter to about 3 millimeters. It is to be understood that any potential variances in length and shape of the hooks 130 are considered to be within the scope of the present FPCB substrate 100, so long as the hook 130 is capable of fixing (e.g., hanging, hitching or other fixing manner) the present FPCB substrate 100 to a tool (e.g., a rack used in plating process).

Figure 3:
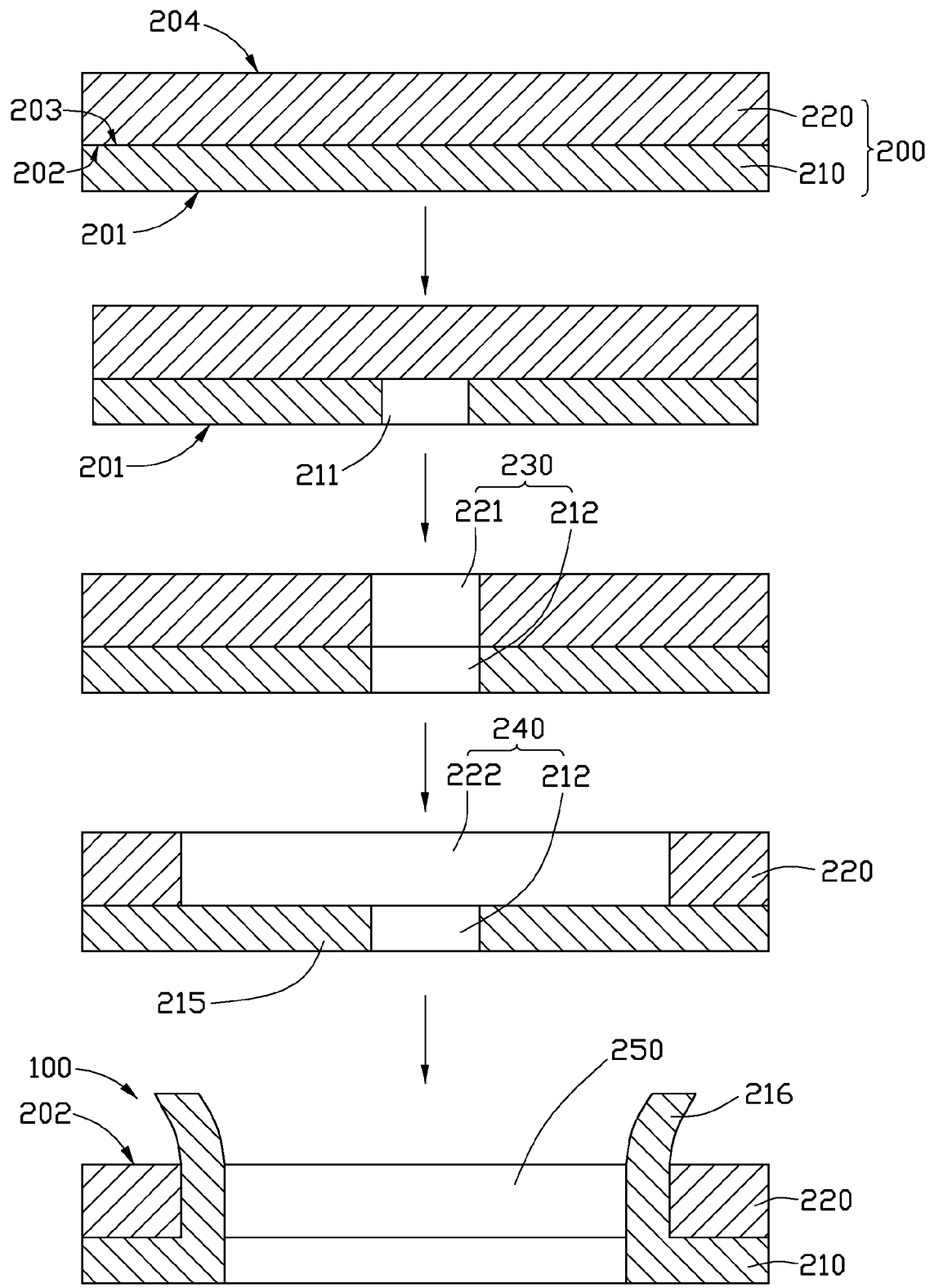
FIG. 3 is a schematic view showing a process of manufacturing the flexible printed circuit board substrate of FIG. 1.

Referring to FIG. 3, a method for manufacturing the FPCB substrate 100 is described in the following.

In a first step, a FPCB material 200 is provided. The FPCB material 200 includes an electrically conductive layer 210 and an insulation layer 220. The electrically conductive layer 210 includes a first surface 201 and a second surface 202 at two opposite sides thereof. The insulation layer 220 includes a third surface 203 and a fourth surface 204 at two opposite sides thereof. The third surface 203 of the insulation layer 220 combines with the second surface 202 of the electrically conductive layer 210.

In a second step, a first through hole 230 extending from the first surface 201 to the fourth surface 204 is formed. First, a first metal hole 211 is formed in the electrically conductive layer 210, and is functioned as a basis to form the first through hole 230. Therefore, a diameter of the first metal hole 211 is less than a diameter of the first through hole 230 to be formed. In the present embodiment, the diameter of the first metal hole 211 is from about 0.5 millimeters to about 1.5 millimeters. The diameter of the first metal hole 211 facilitate the first metal hole 211 as a reference/anchor point, thus a position of the first through hole 230 can be determined accurately. Considering the diameter of from about 0.5 millimeters to about 1.5 millimeters, the first metal hole 211 is usefully formed at the first surface 201 by a chemical etching method. Secondly, the first metal hole 211 is enlarged to form a second metal hole 212, and a portion of the insulation layer 220 corresponding to the second metal hole 212 is eliminated to form a first insulation hole 221, thereby the second metal hole 212 and the first insulation hole 221 compose the first through hole 230. The second metal hole 212 and the first insulation hole 221 are formed by a laser bombarding method. A diameter of the first through hole 230 is from about 1 millimeter to about 2 millimeters.

In a third step, the first insulation hole 221 is enlarged to form a second insulation hole 222, and an exposed edge 215 of the electrically conductive layer 210 surrounding the second metal hole 212 is exposed from the second insulation hole 222. The second metal hole 212 and the second insulation hole 222 compose a second through hole 240. The first insulation hole 221 is enlarged by a laser bombarding method, and a diameter of the second insulation hole 222 is about 4 millimeters. It is to be understood that diameters of the first metal hole 211, the first through hole 230 and the second insulation hole 222 can be predetermined according to a practical requirement of size of the FPCB substrate 100 to be manufactured, so as to stably and reliably fixed the FPCB substrate 100.

Finally, the exposed end 215 is bent towards the insulation layer 220 and extends from the second insulation hole 222 to form a hook 216 (equivalent to the hook 130 in FIG. 2) and a through hole 220 (equivalent to the through hole 103 in FIG. 2). In order to ensure the hook 216 protrudes from the second surface 202, a length of the hook 216 is greater than a sum of a thickness of the electrically conductive layer 210 and the insulation layer 220. In the present embodiment, the length of the hook 216 is in a range from about 1 millimeter to about 3 millimeters.

Figure 4:
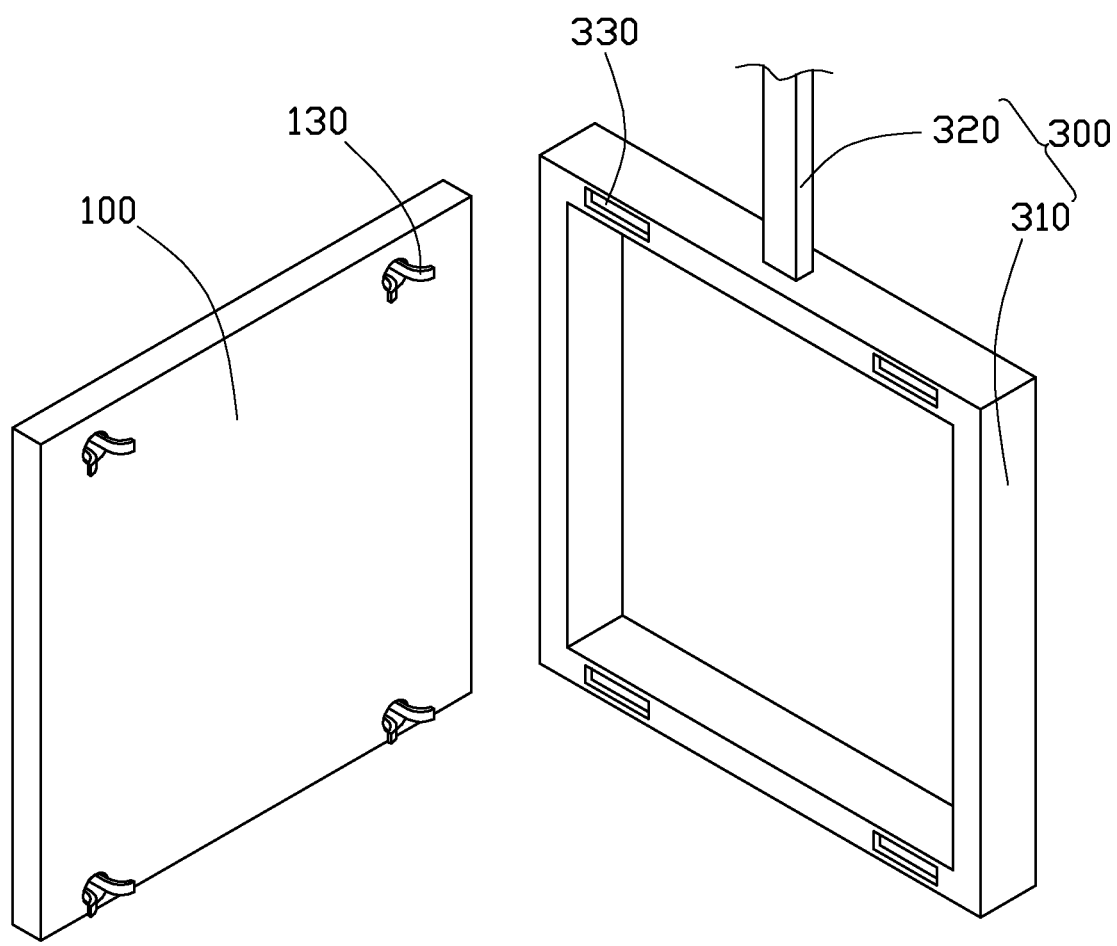
FIG. 4 is a schematic view of a rack for fixing the flexible printed circuit board substrate of FIG. 1.
Figure 5:
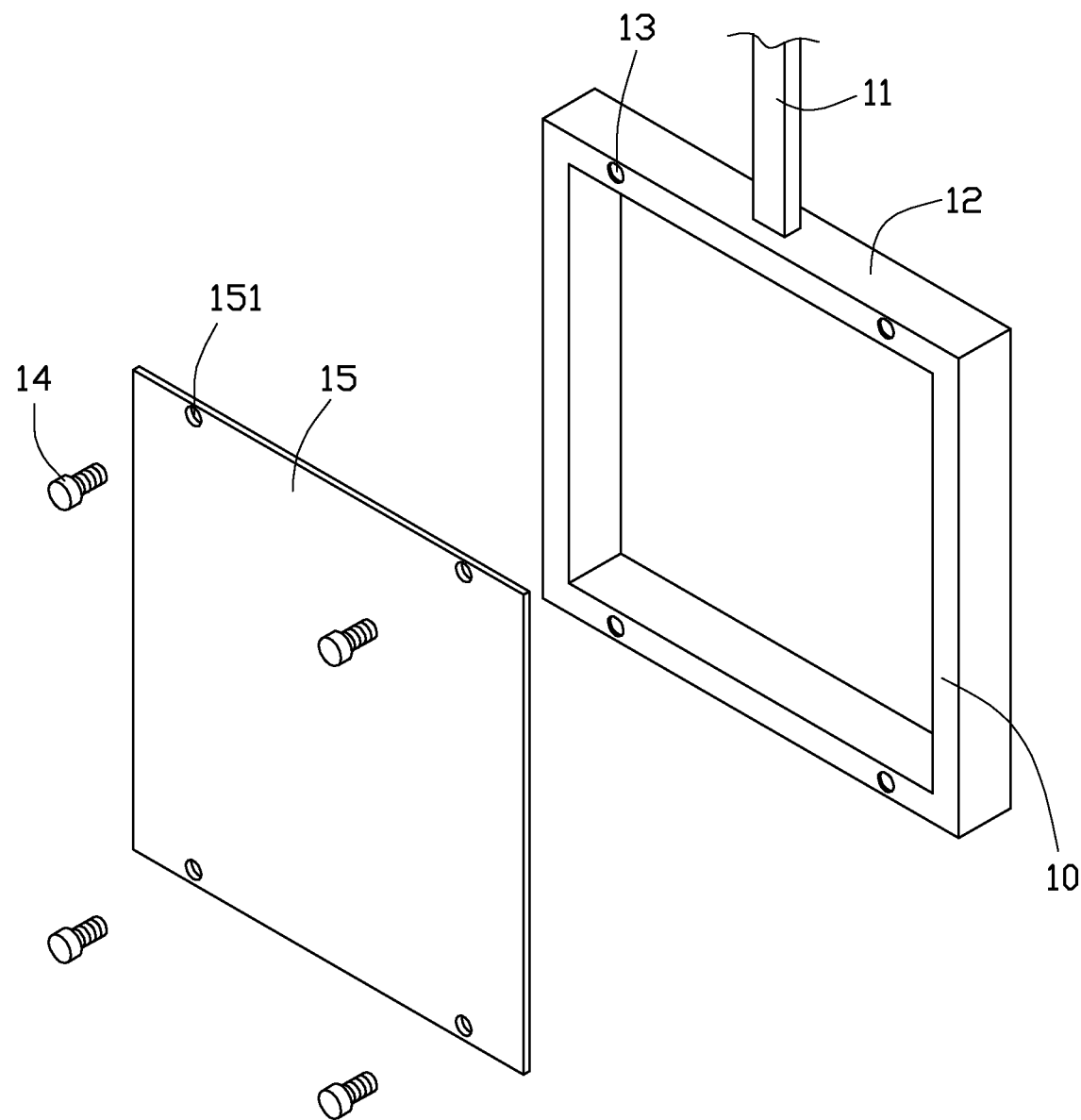
FIG. 5 is a schematic view of a rack for fixing a flexible printed circuit board substrate, according to a related art.
Figure 6:
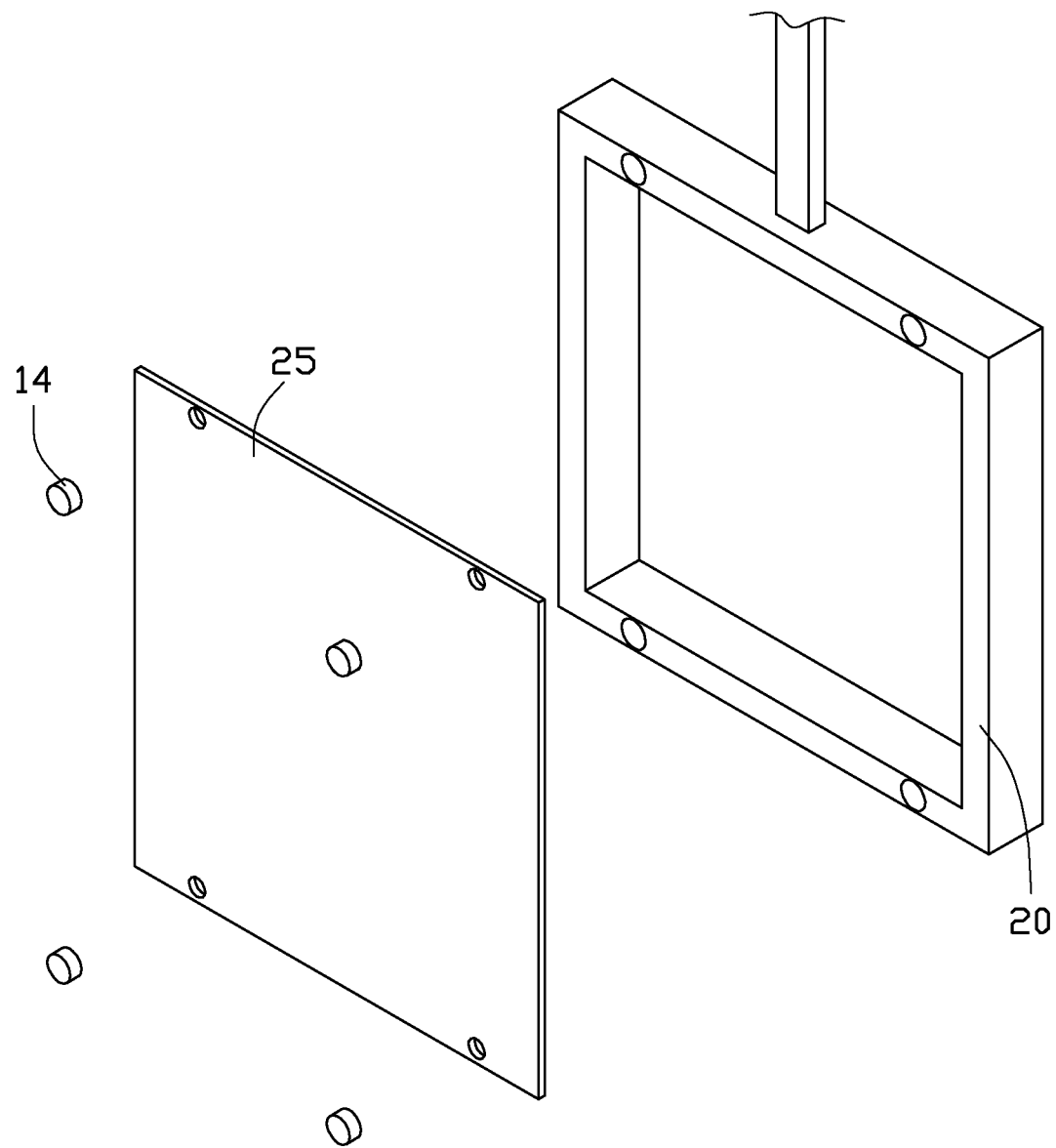
FIG. 6 is a schematic view of another rack for fixing a flexible printed circuit board substrate, according to a related art.

The FPCB substrate 100 is required to undergo sequential processes for manufacturing a final FPCB. In these sequential processes, the FPCB substrate 100 is generally fixed to a rack. Firstly, a rack 300 is provided, as shown in FIG. 4. The rack 300 includes a suspender 320 and a frame 310 connected to the suspender 320. A number of positioning holes 330 are defined in the frame 310 for mating with a number of hooks 130 of the FPCB substrate 100, so as to allow the FPCB substrate 100 to be fixed to the rack 300. Each of the positioning holes 330 is configured (i.e., structured and arranged) for receiving and mating with a corresponding hook 130, thus a location and a shape of each positioning hole 330 are determined by a location and a shape of the hook 130. In the present embodiment, the FPCB substrate 100 has four hooks 130 separately located at four corners of the FPCB substrate 100. The frame 310 has a rectangular configuration similar to the FPCB substrate 100, and four positioning holes 330 separately located at four corners of the frame 310. Secondly, the FPCB substrate 100 is fixed to the rack 300. Four hooks 130 of the FPCB substrate 100 are separately inserted into four positioning holes 330 of the rack 300, as a result, the second end 132 (or two petals 133, 134) of each hook 130 protrudes out of the positioning hole 330, and the FPCB substrate 100 is attached to the frame 310 of the rack 300. Because the second end 132 (or two petals 133, 134) of each hook 130 is curved or oblique relative to the second surface 102, so the curved or oblique second end 132 is blocked by an edge portion of the positioning hole 330, thereby the FPCB substrate 100 is fixed to the rack 300 through the hooks 130.

Compared with the conventional fixing manners, the FPCB substrate 100 includes the hook 130 functioning as the fixing element to fix the FPCB substrate 100 to the rack 300 in the plating or other process. Therefore, conventional fixing manners such as bolts and magnets can be saved, and the assembling and disassembling process are simplified.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:
1. A method for manufacturing a flexible printed circuit board substrate, the method comprising:
   providing a flexible printed circuit board material comprising an insulation layer and an electrically conductive layer formed on the insulation layer, the electrically conductive layer having a first surface and a second surface at an opposite side thereof to the first surface, the insulation layer having a third surface and a fourth surface at an opposite side thereof to the third surface, the third surface of insulation layer coming into contact with the second surface of the electrically conductive layer;
   forming a first metal hole in the electrically conductive layer;
   enlarging the first metal hole to form a larger metal hole, and eliminating a portion of the insulation layer corresponding to the larger metal hole to form a first insulation hole, thereby the larger metal hole and the first insulation hole defining a first through hole, the first through hole extending from the first surface of the electrically conductive layer to the fourth surface of the insulation layer;

enlarging the first insulation hole to form a larger insulation hole, thereby exposing an exposed edge of the electrically conductive layer surrounding the larger metal hole; and bending the exposed edge of the electrically conductive layer to form a petal-shaped hook having two petals which pass through the larger insulation hole and protrude from the fourth surface of the insulation layer.

2. The method as claimed in claim 1, wherein the first metal hole is formed by a chemical etching method, and the diameter of the first metal hole is in a range from about 0.5 millimeters to about 1.5 millimeters.

3. The method as claimed in claim 2, wherein the larger metal hole is formed using a laser bombarding method, and the diameter of the larger metal hole is in a range from about 1 millimeter to about 2 millimeters.

4. The method as claimed in claim 1, wherein the insulation hole is enlarged using a laser bombarding method, and a diameter of the enlarged insulation hole is about 4 millimeters.

* * * * *